(12) United States Patent
Koppitsch et al.

(10) Patent No.: US 9,466,529 B2
(45) Date of Patent: Oct. 11, 2016

(54) MASKING METHOD FOR SEMICONDUCTOR DEVICES WITH HIGH SURFACE TOPOGRAPHY

(71) Applicant: ams AG, Unterpremstaetten (AT)

(72) Inventors: Guenther Koppitsch, Lieboch (AT); Ewald Stueckler, Unterpremstaetten (AT); Karl Rohracher, Graz (AT); Jordi Teva, Veldhoven (NL)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/766,412

(22) PCT Filed: Jan. 29, 2014

(86) PCT No.: PCT/EP2014/051715
§ 371 (c)(1),
(2) Date: Aug. 6, 2015

(87) PCT Pub. No.: WO2014/122055
PCT Pub. Date: Aug. 14, 2014

(65) Prior Publication Data
US 2015/0380308 A1    Dec. 31, 2015

(30) Foreign Application Priority Data
Feb. 8, 2013   (EP) .................... 13154625

(51) Int. Cl.
  *H01L 21/76*   (2006.01)
  *H01L 21/768*  (2006.01)
  *G03F 7/09*    (2006.01)
  *H01L 21/033*  (2006.01)

(52) U.S. Cl.
CPC ......... *H01L 21/76882* (2013.01); *G03F 7/094* (2013.01); *H01L 21/0335* (2013.01); *H01L 21/7685* (2013.01); *H01L 21/76883* (2013.01); *H01L 21/76898* (2013.01)

(58) Field of Classification Search
None
See application file for complete search history.

(56) References Cited

U.S. PATENT DOCUMENTS 6,265,139 B1 *   7/2001   Yun .................. H01L 41/331
                                                        430/315
2010/0330504 A1   12/2010  Irisawa et al.

FOREIGN PATENT DOCUMENTS

EP   1353364 A2     10/2003
FR   2823865 A1 *   10/2002   ............. G03F 7/094

OTHER PUBLICATIONS

Spiering, V. L., et al., "Planarization and Fabrication of Bridges Across Deep Grooves or Holes in Silicon Using a Dry Film Photoresist Followed by an Etch Back", Journal of Micromechanics & Microengineering, Institute of Physics Publishing, Bristol, GB; vol. 5, No. 2, 1994, pp. 189-192.

* cited by examiner

*Primary Examiner* — Reema Patel
(74) *Attorney, Agent, or Firm* — McDermott Will & Emery LLP

(57) ABSTRACT

The method comprises the steps of providing a semiconductor body or substrate (1) with a recess or trench (2) in a main surface (10), applying a mask (3) on the main surface, the mask covering the recess or trench, so that the walls and bottom of the recess or trench and the mask together enclose a cavity (4), which is filled with a gas, and forming at least one opening (5) in the mask at a distance from the recess or trench, the distance (6) being adapted to allow the gas to escape from the cavity via the opening when the gas pressure exceeds an external pressure.

11 Claims, 3 Drawing Sheets

MASKING METHOD FOR SEMICONDUCTOR DEVICES WITH HIGH SURFACE TOPOGRAPHY

BACKGROUND OF THE INVENTION

This invention relates to the manufacture of semiconductor devices with a high surface topography, in particular for the integration of features like MEMS sensors or TSVs.

FR 2 823 865 A1 describes a photolithography method for the application to a substrate having a high surface topography. A planar dry film is applied to the entire substrate surface to cover the open recesses and holes of the substrate. The dry film is subsequently structured to leave only portions of the dry film that close the recesses and holes. The surface topography is thus reduced to allow the areas that are not covered by the remaining portions of the dry film to be subjected to a conventional photolithography.

Mask layers are applied as planar layers continuously covering holes in the substrate or as a lining of sidewalls and bottoms of trenches. Conventional processes for producing the different kinds of mask layers are vacuum-coating and spray-coating, for example. Another method consists of laminating a dry film over the holes, thus forming closed cavities. Gas, especially ambient air, is trapped in the cavities under the environmental conditions prevailing at the time the mask layer is applied. For instance, the gas may have the pressure of an atmosphere under which an etching step is performed. After further process steps the gas pressure in the cavity may exceed the outer pressure, and ruptures in the mask layer may result.

SUMMARY OF THE INVENTION

The method comprises the steps of providing a semiconductor body or substrate with a recess or trench in a main surface, applying a mask above the main surface, the mask covering the recess or trench, so that the walls and bottom of the recess or trench and the mask together enclose a cavity, which is filled with a gas, and forming at least one opening in the mask at a distance from the recess or trench, the distance being adapted to allow the gas to escape from the cavity via the opening when the difference between the pressure exerted on the mask by the gas and a pressure exerted on the mask from outside the recess or trench is larger than a predefined value.

In a variant of the method the mask is applied as a dry film using a lamination technique.

In a further variant of the method the mask forms a planar layer above the recess or trench.

In further variants of the method the distance is less than 5 µm or even less than 3 µm.

In a further variant of the method the recess or trench is provided for a through-wafer via or contact comprising a metal layer.

In a further variant of the method the metal layer is applied to an area of the main surface surrounding the recess or trench, and the mask is used in an etching step to structure the metal layer, so that the opening is transferred to the metal layer.

In a further variant of the method the opening is locally confined in such a manner that the metal layer extends from the recess or trench beyond the opening.

In a further variant of the method the metal layer is structured by etching, a further layer is applied, the mask is applied on the further layer, and the mask is used to structure the further layer.

In a further variant of the method the further layer is a passivation layer, which is also applied in the recess or trench.

In further variants of the method the gas filling the cavity is captured ambient air or nitrogen.

In a further variant of the method the opening is one of a plurality of openings formed in the mask at distances from the recess or trench, the distances being adapted to allow the gas to escape from the cavity via at least one of the openings when the difference between the pressure exerted on the mask by the gas and a pressure exerted on the mask from outside the recess or trench is larger than a predefined value.

The following is a detailed description of examples of the method of producing a semiconductor device.

DETAILED DESCRIPTION

Figure 1:
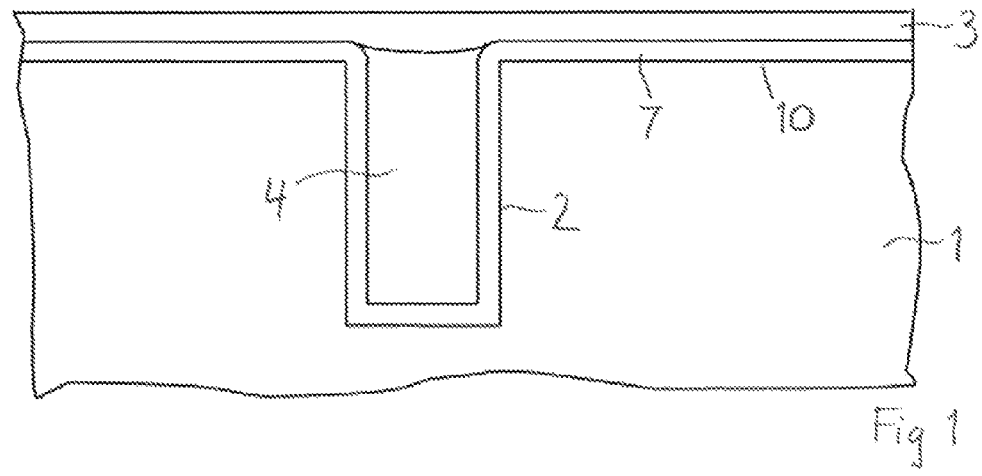
FIG. 1 is a cross section of an intermediate product of an example of the method after the application of a mask layer.

FIG. 1 is a cross section of an intermediate product of an example of the method. A semiconductor body or substrate 1 has a recess or trench 2 in a main surface 10. The recess or trench 2 can be provided for a through-wafer via or through-substrate via (TSV), for instance. The recess may instead be provided for a microelectromechanical sensor or another integrated component that renders a high topography or high aspect ratio of the substrate surface. If the recess or trench 2 is provided for a through-substrate via, a metal layer 7 may be applied to form a vertical electrical connection through the substrate 1. The metal layer 7 may cover the sidewall and bottom of the recess or trench 2 and may extend onto the main surface 10.

A mask 3 is applied above the main surface 10 as a planar layer, which may be formed from a resist, for instance, and may be produced by a dry film technology. The inner volume of the recess or trench 2 is thus closed and forms a cavity 4, which is filled with the ambient gas that is present when the cavity 4 is being closed. The gas may be ambient air, for example, or the gas may be captured from an artificial atmosphere that is present during a process step immediately preceding the application of the mask 3, like a nitrogen atmosphere used during an etching step, for instance. The initial pressure of the gas trapped in the cavity 4 is the same as the outer gas pressure that is prevalent in the moment the cavity 4 is being closed. The gas pressure depends on the temperature and may change during subsequent process steps.

The difference between the pressure exerted on the mask 3 by the gas trapped in the cavity 4 and a pressure exerted on the mask 3 from outside the recess or trench 2 may change in the further process steps and may in particular increase to values above a predefined value. Thus the pressure difference may exceed a maximal value which is regarded as a tolerable limit. The limit value is predefined according to individual requirements and may especially depend on the mechanical resistance and the adhesive strength of the mask layer.

Figure 2:
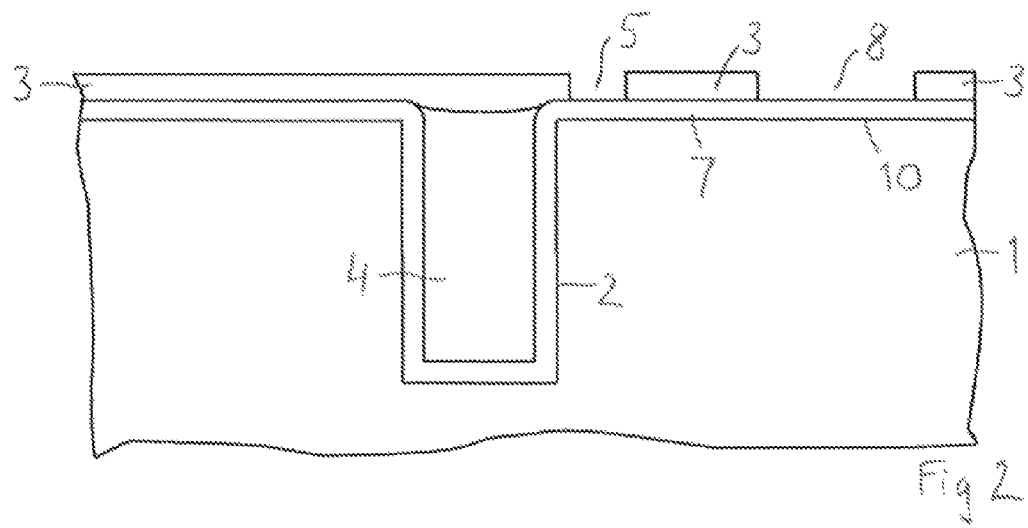
FIG. 2 is a cross section according to FIG. 1 after the formation of mask openings.

FIG. 2 is a cross section according to FIG. 1 after the formation of at least one opening 5 in the mask 3 at a small distance from the recess or trench 2. Further openings 8 are provided in the mask 3 according to the intended structure that is to be produced in a subsequent etching step. The opening 5 near the recess or trench 2 is provided as a vent to allow the gas to escape from the cavity 4.

Figure 3:
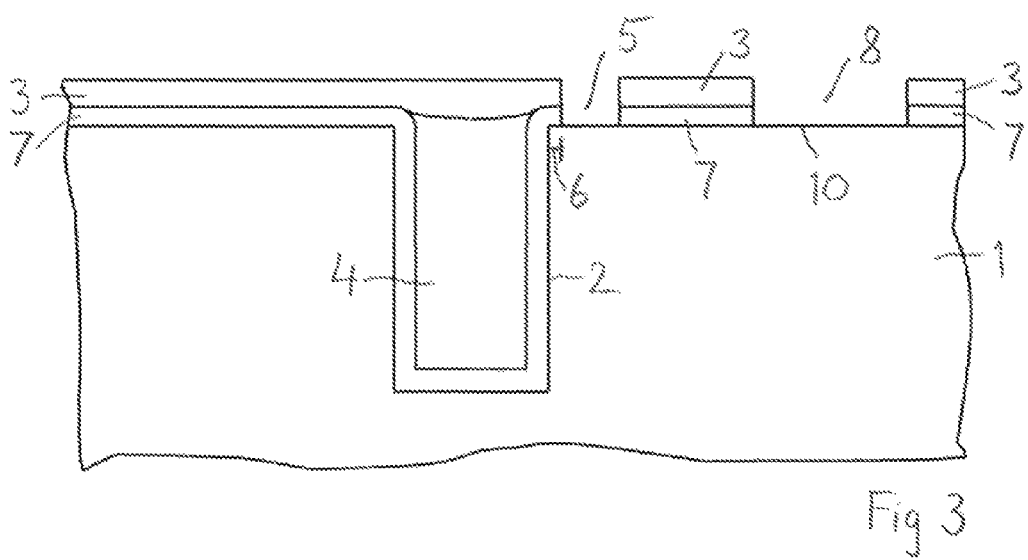
FIG. 3 is a cross section according to FIG. 2 of a further intermediate product obtained after the mask has been used to structure a metal layer.

FIG. 3 is a cross section according to FIG. 2 and shows the device after the mask 3 has been used to structure the metal layer 7 and/or further layers not shown in the figures. The size of the opening 5 may be kept small, so that the metal layer 7 can also be removed in the opening 5 without adversely affecting the device structure and the performance of the device during its later operation. The opening 5 may be designed in such a way that no wet chemicals like water or developer are able to enter the cavity. The distance 6 between the opening 5 and the recess or trench 2 may be typically about 2 µm, for instance. In optional embodiments the distance 6 is less than 5 µm, in particular less than 3 µm.

During the pump down procedure in an RIE (reactive ion etching) process, lowering the external pressure below the pressure of the gas trapped in the cavity 4, the expansion of the gas that is trapped in the cavity 4 causes the mask 3 to be lifted next to the opening 5. Due to the localized lifting of the mask 3 from the main surface 10, at least some of the trapped gas escapes through the opening 5, which thus provides a suitable venting feature. In this way the gas pressures inside and outside the cavity 4 are balanced.

Figure 4:
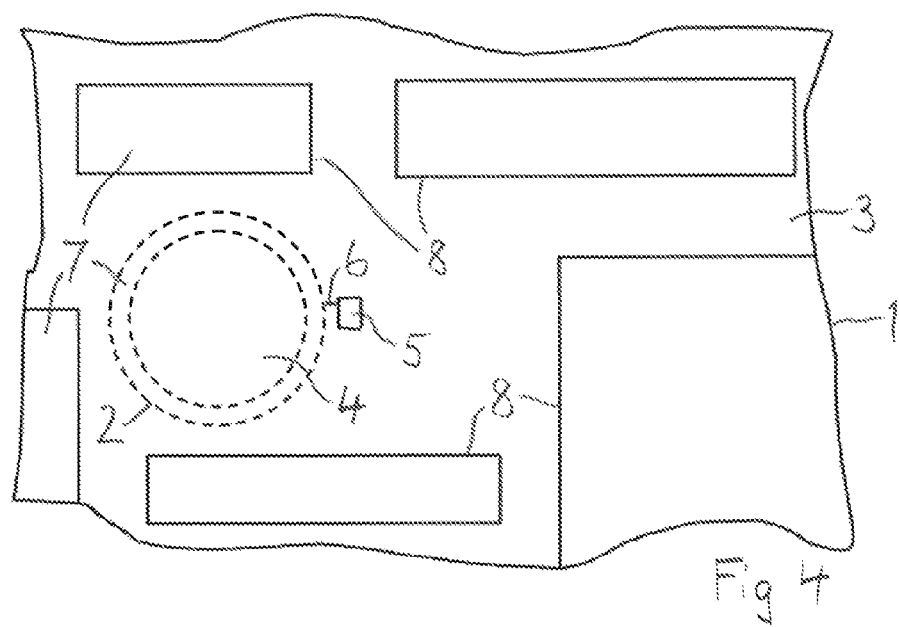
FIG. 4 is a schematic plan view of the arrangement of a recess or trench and mask openings.

FIG. 4 is a schematic plan view of the arrangement of a recess or trench 2 and mask openings 5, 8. The hidden contours of the recess or trench 2 and the portion of the metal layer 7 covering the sidewall of the recess or trench 2 are shown with broken lines surrounding the cavity 4. The opening 5 that is arranged at a small distance 6 from the recess or trench 2 is provided as a vent of the cavity 4 in the manner described above. The further openings 8 of the mask 3 are provided to structure the metal layer 7. The further openings 8 may be larger than shown in FIG. 4, so that the mask 3 only covers conductor tracks that are to be left from the metal layer 7 on the main surface 10, for example.

Figure 5:
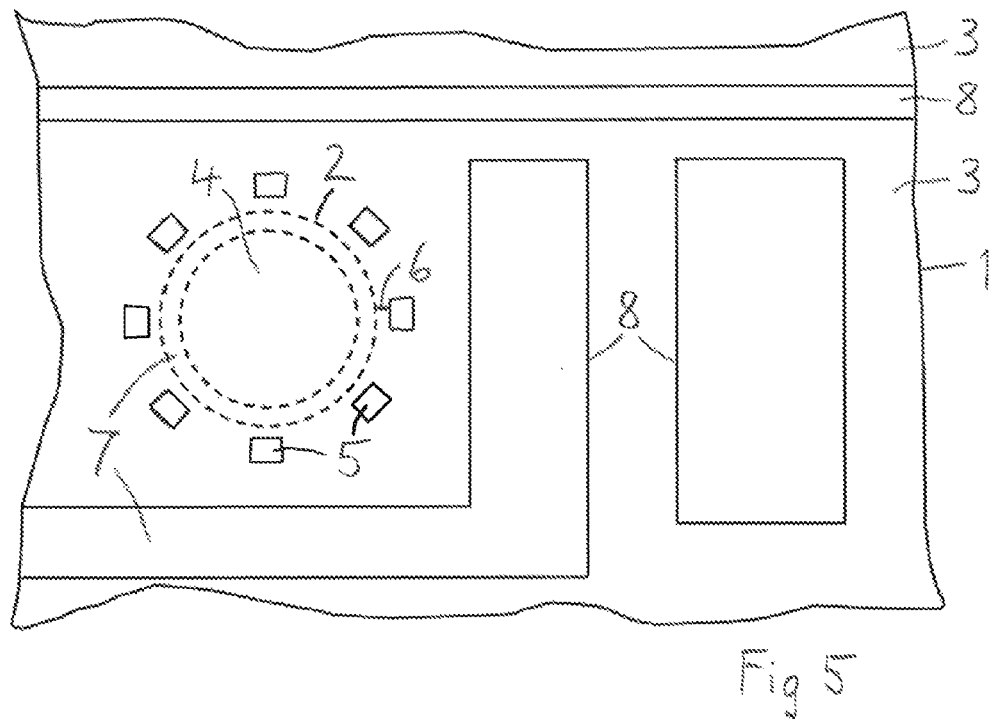
FIG. 5 is a schematic plan view of a further arrangement according to FIG. 4.

FIG. 5 is a schematic plan view of a further arrangement according to FIG. 4. In the embodiment according to FIG. 5 the opening 5 is one of a plurality of openings 5, which are arranged on the periphery of the recess or trench 2. The sizes, number and arrangement of the openings 5 can be designed according to the requirements of individual embodiments.

Figure 6:
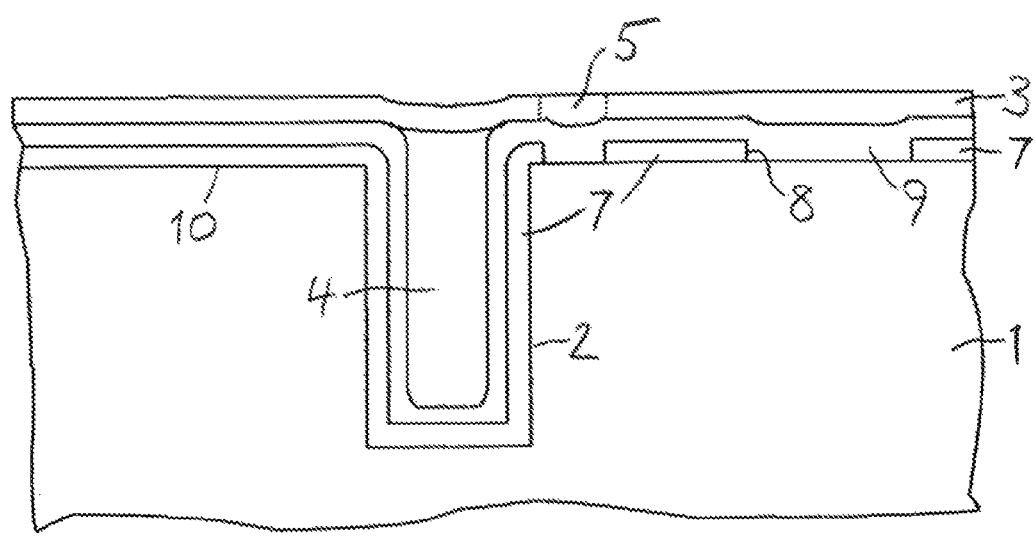
FIG. 6 is a cross section according to FIG. 1 for a further embodiment.

FIG. 6 is a cross section according to FIG. 1 for a further embodiment. The elements of the embodiment according to FIG. 6 that are similar to corresponding elements of the embodiment according to FIG. 1 are designated with the same reference numerals. In the process step that is represented in FIG. 6, the metal layer 7 provided for the through-wafer via has already been structured. For the etching step that is performed to structure the metal layer 7, a mask with a venting feature according to the above description may have been used. This is indicated by the structure of the metal layer 7 shown in FIG. 6, which is similar to the structure of the metal layer 7 shown in FIG. 3. A further layer 9 has been applied, which may be a passivation layer, for instance. The further layer 9 is to be structured using the mask 3, which may be a resist mask (or a further resist mask). The mask 3 is going to be provided with at least one opening 5 at a small distance from the recess or trench 2, as indicated by the dotted vertical lines in FIG. 6. The opening 5 has the same venting purpose as the opening 5 of the mask 3 described above in conjunction with FIGS. 1 to 3. The example shown in FIG. 6 is given to indicate how a mask 3 that is provided with a venting feature as described can be applied to various layers in different process steps or repeatedly to different layers in two or more process steps.

The method enables the use of dry film technology for the masking of high aspect ratio topographies. Deep etched features having dimensions or spacings up to 500 µm covered with a masking resist layer can be processed in low-pressure reactors without the risk of mask rupture and/or delamination. This is accomplished by the use and layout of venting features at the perimeter of the covered structure. The geometry is designed in a way that the resist interface just opens in the predefined area under specific sub-atmospheric pressure conditions to balance detrimental overpressure. Dry film technology using a well-known and controllable lamination technique enables high throughput. Only few process parameters have to be controlled. The quality of the dry film mask can be easily controlled at the surface of the wafer and is not affected by the topography. Critical topography is thus easily eliminated by covering deep structures.

The invention claimed is:

1. A method of producing a semiconductor device, comprising:
   providing a semiconductor body or substrate having a main surface with a recess or trench in the main surface;
   applying a mask above the main surface, the mask covering the recess or trench, so that the recess or trench and the mask form a closed cavity, which is filled with a gas; and
   forming a plurality of openings in the mask, the openings being arranged on the periphery of the recess at a distance from the recess or trench, the distance being adapted to allow the gas to escape from the cavity via the openings when the difference between a pressure exerted on the mask by the gas and a pressure exerted on the mask from outside the recess or trench is larger than a predefined value.

2. The method of claim 1, wherein the mask is applied as a dry film using a lamination technique.

3. The method of claim 1, wherein the mask forms a planar layer above the recess or trench.

4. The method of claim 1, wherein the distance is less than 5 µm.

5. The method of claim 1, wherein the distance is less than 3 µm.

6. The method of claim 1, wherein the gas filling the cavity is captured ambient air.

7. The method of claim 1, wherein the gas filling the cavity is nitrogen.

8. A method of producing a semiconductor device, comprising:
   providing a semiconductor body or substrate having a main surface with a recess or trench in the main surface;
   applying a mask above the main surface, the mask covering the recess or trench, so that the recess or trench and the mask form a closed cavity, which is filled with a gas; and
   forming at least one opening in the mask at a distance from the recess or trench, the distance being adapted to allow the gas to escape from the cavity via the at least one opening when the difference between a pressure exerted on the mask by the gas and a pressure exerted on the mask from outside the recess or trench is larger than a predefined value, wherein the recess or trench is provided for a through-wafer via or contact comprising a metal layer, and wherein the metal layer is applied to an area of the main surface surrounding the recess or trench, and the mask is used in an etching step to structure the metal layer, so that the at least one opening is transferred to the metal layer.

9. The method of claim 8, wherein the at least one opening is locally confined in such a manner that the metal layer extends from the recess or trench beyond the at least one opening.

10. The method of claim 8, wherein the metal layer is structured by etching, a further layer is applied, the mask is applied on the further layer, and the mask is used to structure the further layer.

11. The method of claim 10, wherein the further layer is a passivation layer, which is also applied in the recess or trench.

* * * * *